Nov. 8, 1960 | J. R. MORISON | 2,958,926

ELECTRICAL CIRCUIT STRUCTURE AND METHOD FOR MANUFACTURING SAME

Filed Oct. 22, 1956 | 5 Sheets-Sheet 1

INVENTOR.
JACK R. MORISON

BY Lippincott & Smith

ATTORNEYS

Nov. 8, 1960

J. R. MORISON

ELECTRICAL CIRCUIT STRUCTURE AND METHOD FOR MANUFACTURING SAME 2,958,926

Filed Oct. 22, 1956

5 Sheets-Sheet 2

INVENTOR.
JACK R. MORISON

BY Lippincott & Smith

ATTORNEYS

Nov. 8, 1960

J. R. MORISON

ELECTRICAL CIRCUIT STRUCTURE AND METHOD FOR MANUFACTURING SAME 2,958,926

Filed Oct. 22, 1956

5 Sheets-Sheet 3

INVENTOR.
JACK R. MORISON

BY Lippincott & Smith

ATTORNEYS

Nov. 8, 1960

J. R. MORISON

ELECTRICAL CIRCUIT STRUCTURE AND METHOD FOR MANUFACTURING SAME 2,958,926

Filed Oct. 22, 1956

5 Sheets-Sheet 4

INVENTOR.
JACK R. MORISON

BY Lippincott & Smith

ATTORNEYS

INVENTOR.
JACK R. MORISON
BY Lippincott & Smith

United States Patent Office 2,958,926

Patented Nov. 8, 1960

2,958,926

ELECTRICAL CIRCUIT STRUCTURE AND METHOD FOR MANUFACTURING SAME

Jack R. Morison, Millbrae, Calif., assignor to Lenkurt Electric Co., Inc., San Carlos, Calif., a corporation of Delaware Filed Oct. 22, 1956, Ser. No. 617,598

1 Claim. (Cl. 29—155.5)

This invention relates to the structure and fabrication of electrical circuits, and in particular to chassis subassemblies and the like for electronic and other electrical apparatus.

With rapid increases in the complexity and manufacturing volume of electronic and other electrical apparatus, a pressing need has developed for faster, less expensive and more reliable ways to fabricate electrical networks such as chassis sub-assemblies and the like. Considerable attention has been given to proposals for the use of automatic and semiautomatic machines—in other words, automation. However, it seems that conventionally wired chassis are not well adapted for automatic production. For this and other reasons, interest has centered on relatively new types of circuit structures such as printed and etched circuits. While they are exceedingly useful in some applications these newer circuit structures are not without their disadvantages with respect to circuit design limitations, manufacturing problems, maintenance and repair.

Accordingly, an object of this invention is to provide improved circuit structures and methods for their manufacture that are especially well adapted to the application of automatic and semi-automatic production techniques. Further objects and advantages will appear as the description proceeds.

Briefly stated, in accordance with certain aspects of this invention the wiring of an electrical network assembly or chassis subassembly is fixed to a sheet of insulating material by means of folded portions of the wires that pierce the insulating sheet and form terminal posts extending outward from one side of the sheet. Various circuit components (which may include but are not limited to resistors, capacitors, inductors, transformers, rectifiers, transistors, vacuum tubes and relays) are arranged on one side of the insulating sheet with their electrical leads passing through the sheet to the other side where the leads are attached to respective ones of the terminal posts for connecting the circuit components to the wires.

This circuit structure has numerous advantages whether it is fabricated with automatic machinery or with simple hand tools. An endless variety of standard and nonstandard circuit components may be utilized. It can easily be combined with other circuit structures—for example, a printed circuit with attached leads may be used as one of the circuit components in the circuit structures herein described. Wires of various sizes may be used, giving great freedom of design without waste of expensive material. The structure can be made strong and rugged. Circuit connections may be held together by mechanical stress as well as by soldering, thereby providing the best and strongest type of electrical joint. An ideal configuration for the use of dip-soldering techniques is provided. Inspection is greatly facilitated by the fact that all connections are made on one side of the insulating board, while the components are on the other side, so that any faulty or omitted connection is easily detected. In fact, automatic inspection by machine is feasible. Terminals are readily available for test purposes. If desired, any selected ones of the connections may be left open for test purposes until a later stage of manufacture. All assembly operations are exceedingly simple and are performed at readily accessible points. Since special materials are not required storage and material-handling requirements are less stringent than for many other manufacturing processes. Repairs and maintenance are easier to make.

A significant and great advantage of the improved circuit structures is their adaptability to automatic machine fabrication, as will readily be appreciated from consideration of the examples and embodiments hereinafter described.

The invention will be better understood from the following detailed description taken in connection with the accompanying drawings and its scope is pointed out in the appended claim. In the drawings:

Figure 1:
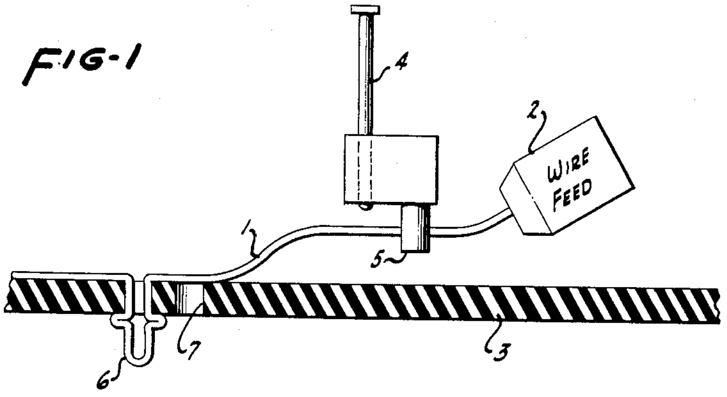
Figs. 1 through 5 are schematic views representing five successive stages in the fabrication of a circuit structure in accordance with principles of this invention.

Referring now to the drawings, Figs. 1 through 5 are fragmentary simplified schematic representations of five successive stages in the manufacture of an electrical network assembly according to the present invention. In actual practice the tools employed in fabricating the circuit structure usually are parts of an automatic or semiautomatic machine operating under the control of templates, recorded tapes, or other information storage and control devices. On the other hand, simple hand tools may be employed equally well except for considerations of speed, economy and the like. Since the present invention concerns the product and the method of its manufacture and is not concerned with details of the production tools and machinery, the tools are illustrated in a fragmentary and schematic-manner and they will be described only to the extent necessary for an understanding of this invention.

With particular reference to Fig. 1, an electrically conductive wire 1 is withdrawn from a feeding device 2 while the feeding device is moved along one side of a flat sheet or board of electrically insulating material 3. A combined piercing tool 4 and punch 5 is employed for driving wire 1 through sheet 3 at selected points to form terminal posts such as post 6 and to punch holes such as hole 7 substantially simultaneously. Just before piercing tool 4 is operated, a certain amount of slack is introduced into the wire 1 (for example, by moving feed device 2 slightly toward the left) so that the wire will not be broken when it is driven through the insulating board.

Figure 2:
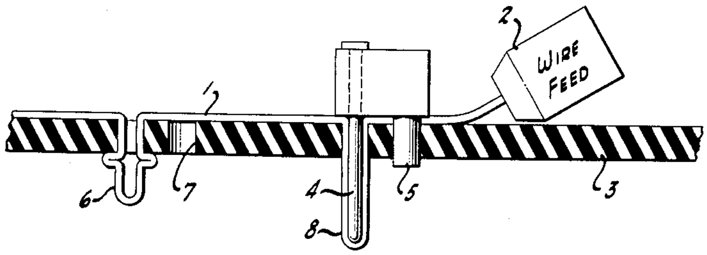

When piercing tool 4 and punch 5 are driven downward to the position shown in Fig. 2, the piercing tool pushes a portion of wire 1 through insulating sheet 3 to form a folded portion 8, bent transverse to the length of the wire, that pierces sheet 3 and extends outward from and substantially perpendicular to its other side. These folded portions fix the wires to the insulating sheet and also serve as terminal posts, as is hereinafter more fully explained. Punch 5 makes a hole through sheet 3 near each terminal post.

Figure 3:
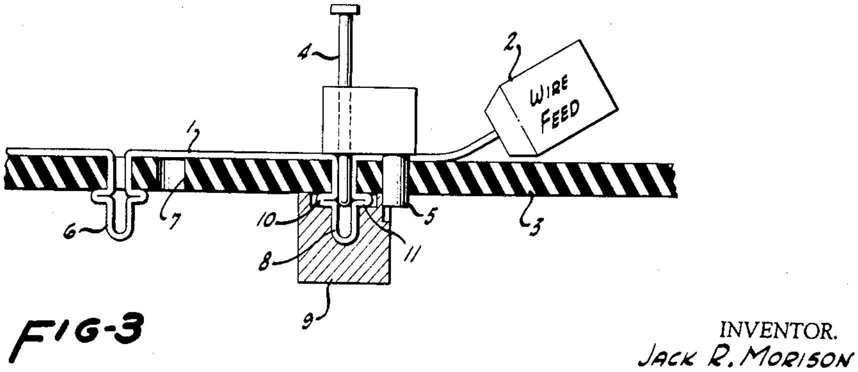

As is shown in Fig. 3 an upsetting tool 9 may be driven against the lower end of folded portion 8, or a backup die of similar form used when the wire is driven through the sheet, to crimp the wire at 10 and 11 for fixing the wire more securely to the insulating sheet. Other electrically conductive wires are fixed to sheet 3 in the same manner. Portions of each wire extend along the upper side of sheet 3 and each wire has folded portions that pierce the insulating sheet and form terminal posts projecting from the lower side of the sheet. The wires follow various paths on the insulating sheet, and in particular they may change direction at each terminal post. Each wire follows the path taken by feed device 2 while that wire was being installed and the wires are fixed in position by the folded portions that pierce the insulating sheet. The wires may be of various lengths, the wire being cut when the appropriate length has been withdrawn from feed device 2. Ways in which wires may be crossed without electrical contact, when such is required, are hereinafter discussed.

Figure 4:
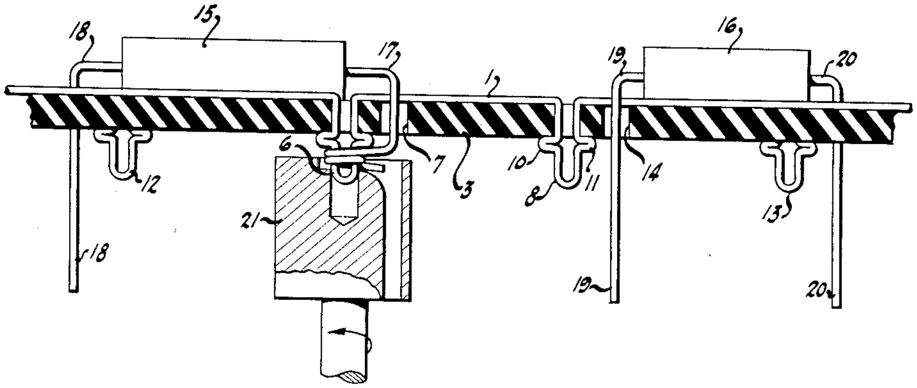
Figure 5:
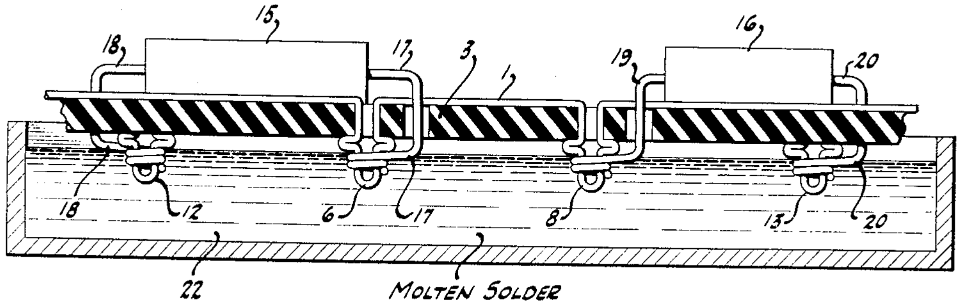

Fig. 4 shows a part of wire 1 including two terminal posts 6 and 8, and also shows other terminal posts 12 and 13 that are parts of one or more other wires fixed to insulating sheet 3 in a manner similar to wire 1. At the time that post 8 was formed, punch 5 made a hole 14 through sheet 3. Other holes through sheet 3, not visible in the drawing, are adjacent to terminal posts 12 and 13. The holes are near the points where the wires pierce the sheet, but are slightly spaced and separated therefrom by portions of the insulating sheet so that when component leads are passed through the holes and fastened to the terminal posts, as hereinafter explained, the wires and the components are securely locked in place.

Various circuit components are arranged on the upper side of sheet 3 with their electrical leads extending downward through the holes that have been punched in the insulating sheet, as shown in Fig. 4. Circuit components 15 and 16, generally lumped-constant impedors, may be resistor, capacitors, inductors, crystal rectifiers, or any other electrical circuit elements that may be required in the construction of a particular electrical network. Component 15 has electrical leads 17 and 18 that extend respectively through hole 7 and through a similar hole adjacent to terminal post 12. Component 16 has leads 19 and 20 that extend respectively through hole 14 and through a similar hole adjacent to terminal post 13. Thus each lead extends through a hole in sheet 3 adjacent to one of the terminal posts.

In the next step of manufacture the leads are mechanically attached to the terminal posts, preferably by wrapping the end of each lead tightly about the adjacent terminal post. This can be done by a conventional wrapping tool, which is schematically represented at 21 in the process of wrapping lead 7 about terminal post 6. In a similar manner the end of lead 18 is wrapped about terminal post 12, the end of lead 19 is wrapped about terminal post 8 and the end of lead 20 is wrapped about terminal post 13. After this has been done the circuit components are securely fixed in place on sheet 3 and are electrically connected to the circuit wiring. Additional fastening means of any conventional type may be used to assist in holding heavy components, such as transformers and the like, securely in place.

Strong mechanical and electrical connections have now been made at each circuit junction. Mechanical stress in the tightly wrapped leads insures secure joints. For long trouble-free life with low electrical resistance, each connection should also be soldered. With the circuit construction that has been described this is easily accomplished in the manner illustrated in Fig. 5. Since all of the connections are at terminal posts extending outward from the lower side of sheet 3 the connections can all be soldered at the same time simply by dipping the terminal post into a bath of molten solder 22, as shown. After removal from the solder bath the circuit sub-assembly has been completed.

At times it may be desirable to leave circuit connections open during preliminary stages of manufacture to facilitate electrical testing of the partly completed circuit. In circuits constructed according to the present invention this is quite easily done since the circuit will remain open if any lead is not wrapped about one of the terminal posts. The separation between the unwrapped leads and the terminal posts is sufficient that the circuit will not be closed by the solder dip. After the test has been completed the open circuit connection can be closed by wrapping and soldering with hand tools, or in any other appropriate manner.

If desired, additional circuit components may be mounted on the same side of the insulating board as the terminal posts. The leads of these additional components may be attached to the terminal posts by hand soldering, welding, or other means.

It should be appreciated that the steps just described do not constitute the only process by which the product can be manufactured, although they do illustrate the preferred process that constitutes one aspect of this invention. As an example of other manufacturing processes that might be used, lengths of conductive wire may be cut and bent to substantially their final sizes and shapes, and then be affixed to the insulating board by simultaneously driving all of the terminal posts through the insulating board. The holes for the component leads may be punched before or after the wires are affixed to the sheet of insulation, or the leads can be driven through the insulating sheet by a sort of stapling machine without the prior punching of holes to receive the leads. Connections between the leads and the terminal posts can be made in a variety of ways, and soldering may be done by hand rather than by the dip method, or may in some cases be omitted. Other manufacturing processes and variations may occur readily to those skilled in the art.

It will also be appreciated that variations in the product may be made without departing from the principles of the invention. For example, considerable changes may be made in the form of the terminal posts by means of obvious changes in the piercing and upsetting tools. The terminals may not always be crimped at 10 and 11 since the wires may be adequately fixed to the insulating sheet without such crimping in some cases, and in such cases the use of upsetting tool 9 can be eliminated. In other cases fastening may be required at points where a terminal post is not required. At such points a shorter length of the wire may be driven through the insulating sheet and if desired a different form of upsetting tool may be employed to form a flat loop or head in the wire against the lower side of the insulating sheet. These and other modifications are illustrated in the embodiment represented by Figs. 6 through 12.

Reference is now made to Figs. 6 through 12, which illustrate how principles of this invention may be applied to the construction of a practical electrical network. The circuit chosen for illustration is a simple one-stage vacuum tube amplifier. The greatest practical advantages of this invention come from its application to larger and more complex networks and sub-assemblies, but the principles can be understood more easily and as well from a simple circuit.

Figure 6:
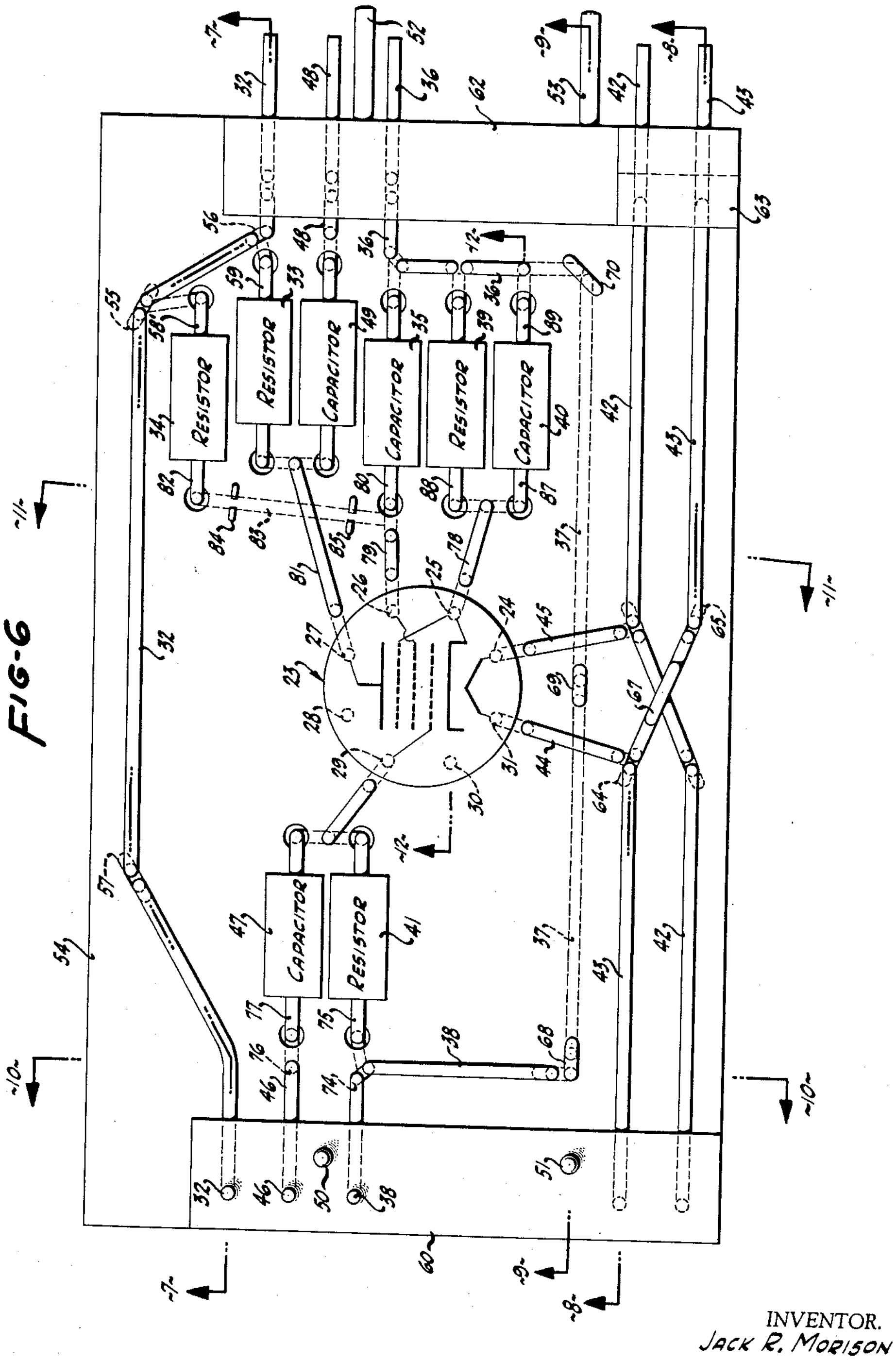
Fig. 6 is a plan view of a simple electrical circuit illustrating various construction details and alternatives as well as certain general principles of this invention.

With particular reference to Fig. 6, the circuit shown is conventional electrically and operationally. It is novel with respect to the manner in which it is constructed. A pentode vacuum tube is represented somewhat conventionally at 23 and has an octal base with eight pins identified by reference numerals 24 through 31. Two of the pins have no electrical connection, while the other six are connected to various electrodes of the tube represented in the usual schematic manner. In the embodiment shown, electrical connections are made directly to the pins of the vacuum tube but it is evident that a tube socket could be employed without materially affecting the principles of the circuit construction.

Plate voltage is supplied to the vacuum tube through a conductor 32 and a plate load resistor 33. The screen grid is connected to conductor 32 through a resistor 34 and is connected through a by-pass capacitor 35 to the circuit "ground" formed by conductors 36, 37 and 38 in series. The cathode and the suppressor grid are connected together internally and are connected to circuit "ground" through a resistor 39 and a by-pass capacitor 40 in parallel. The control grid is connected to circuit "ground" through a grid-leak resistor 41. Filament current is supplied through conductors 42, 43, 44 and 45. Input signals are received through a conductor 46 that is connected to the control grid through a capacitor 47. Output signals are supplied through a conductor 48 that is connected to the plate through a capacitor 49. The circuit operates in a well known manner to amplify electric signals received through conductor 46 from some signal source (not shown) connected thereto and to supply the amplified electric signals through conductor 48 to some load (not shown) connected thereto.

An important feature which should be noted is the manner in which the ends of various conductors are brought out from respective ends of the sub-assembly to form male connectors. These male connectors or plugs may mate with simple female connectors or sockets (not shown) for making electrical connections between the sub-assembly illustrated and other portions of the chassis or other sub-assemblies. Locator pins 50, 51, 52 and 53 help to aline the male connectors with the corresponding female connectors. Alternatively, if so desired, the female connectors may be omitted, and wrapped and soldered joints or other permanent connections may be made between the corresponding conductors of adjacent sub-assemblies.

The entire sub-assembly is mounted on a sheet 54 of electrically insulating material, which may be a phenolic board of a type widely used in electrical work for making insulating panels and supports. Preferably board 54 has substantially flat parallel upper and lower sides. Most of the circuit wiring is fixed on the board by folded portions of the wires that pierce the insulating board in the manner hereinbefore explained. The electrical circuit components (i.e., the vacuum tube, resistors and capacitors) are supported by their leads which extend through holes punched in the insulating board and are attached to wiring terminals on the under side of the board.

Figure 7:
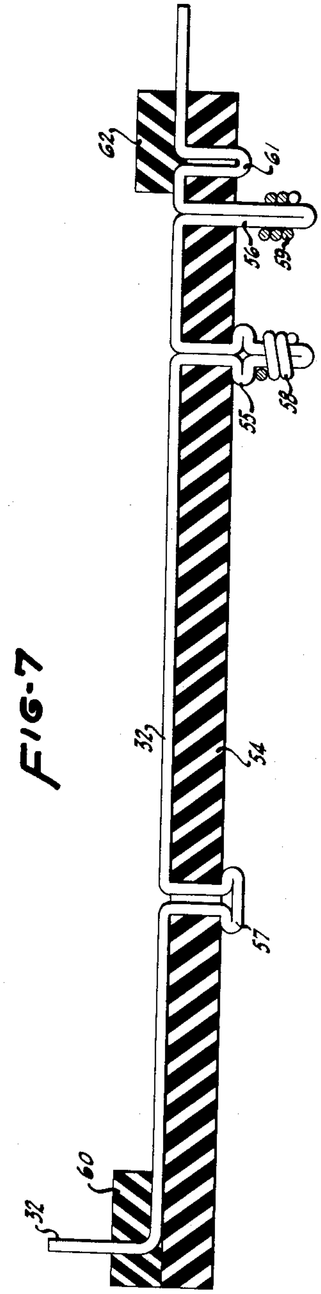
Fig. 7 is a section taken along the line 7—7 of Fig. 6.

Particular reference is now made to Fig. 7 which is a section taken along the path of conductor 32. Folded portions 55, 56, and 57 of wire 32 pierce insulating sheet 54. The folded portion 55 has the form of a crimped terminal post substantially like (and made in the same manner as) the terminal posts illustrated in Figs. 1 through 5. One lead 58 of resistor 34 is attached to this terminal. The folded portion 56 forms an uncrimped terminal post. It is made by forcing a somewhat shorter length of the wire 32 through the insulating board. One lead 59 of resistor 33 is attached to this terminal.

From Fig. 6 it will be noted that wire 32 changes direction on board 54 at each of the folded portions, 55, 56 and 57, and that these folded portions serve to fix the wire securely in place on the insulating board in addition to the function of portions 55 and 56 in forming terminal posts. The folded portion 57 serves as a fastening means only, since no electrical connection to wire 32 is required at this point. The fastening at 57 is made by driving a somewhat shorter length of the wire 32 through the insulating board and then using a different type of upsetting tool to flatten the wire against the lower side of board 54, as shown.

The left end of wire 32 is bent upward perpendicular to insulating board 54, as shown, and extends through a hole in an insulating strip 60 that is cemented, bolted or otherwise attached to the left end of board 54. The left ends of wires 38 and 46 are similarly bent upward through holes in strip 60 and these upwardly extending ends of the wires, together with locating pins 50 and 51, form a male connector adapted to mate with a female connector that can be placed over strip 60.

The right end portion of wire 32 has a folded portion 61 that pierces board 54, as shown, to prevent lengthwise movement of the end of the wire. The end of the wire then extends outward beyond the right end of the insulating board and it is secured against vertical movement by means of an insulating strip 62 that is cemented, bolted, or otherwise attached to the right end of board 54. The right ends of wires 36 and 48 similarly extend beyond the right end of the insulating board and these wire ends, together with locating pins 52 and 53, form a male connector for mating with a female connector that can be placed in abutting relation to the right end of the sub-assembly.

Figure 8:
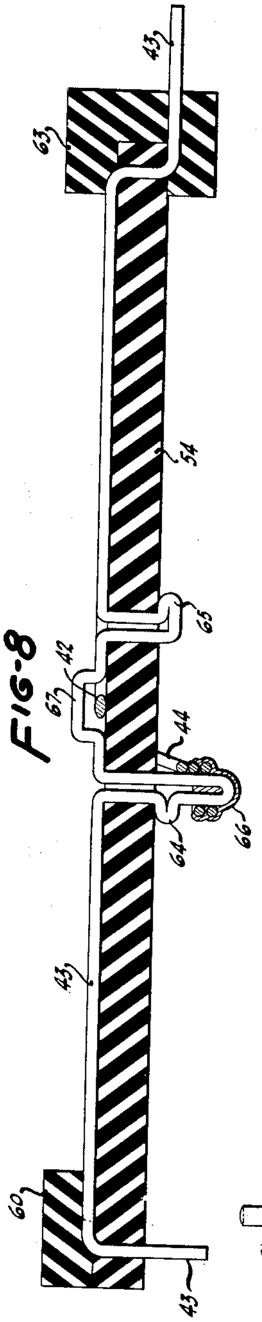
Fig. 8 is a section taken along the line 8—8 of Fig. 6.

Fig. 8 is a section taken along the path of wire 43. It will be noted that the left end of wire 43 is bent downward so that it pierces insulating sheet 54 and extends perpendicularly downward from its lower side. The left end of wire 42 is bent downward in a similar manner and these two ends, together with downward extensions of locator pins 50 and 51, form a male connector for mating with a female connector that can be placed below the left end of board 54. At the right end of the sub-assembly wire 43 is bent or offset so that it passes through board 54 and then extends outward to the right from the lower side of the insulating board. The right end of wire 42 is bent in a similar manner and the two wires pass through two holes in a block 63 of insulating material fitted onto the right edge of board 54, as shown. Thus the right ends of wires 42 and 43 form an alternative male connector adapted to mate with a female connector abutting the right end of the sub-assembly.

Wire 43 has two folded portions 64 and 65 that pierce insulating sheet 54. Portion 64 is a half-crimped terminal post—that is, only one side of the folded portion is crimped. One end of wire 44 is wrapped around this terminal post, and the joint has been soldered as indicated at 66. It should be understood that all of the electrical connections preferably are soldered but in most cases the solder is not shown because the illustration is clearer without it. Wire 44 has the form of a substantially U-shaped staple with both its ends driven through the insulating board. One end of wire 44 is attached to terminal post 64, and the other end of wire 44 is attached to pin 31 of the vacuum tube so that wire 44 forms an electrical connection between wire 43 and the vacuum tube filament. Folded portion 65 is for fastening purposes only and therefore it is not formed into a terminal post. It is made by forcing a somewhat shorter length of wire 43 through the insulating board and then driving the end of the loop to one side against the bottom of board 54.

Fig. 8 illustrates one way in which two conductors can cross without electrical contact. This is accomplished simply by bending a portion 67 of wire 43 into an arch that straddles wire 42 without touching it. As long as the span of the arch is small and its ends are located close to folded portions that pierce the insulating board, this is a simple and effective means for avoiding electrical contact between two crossing conductors.

Figure 9:
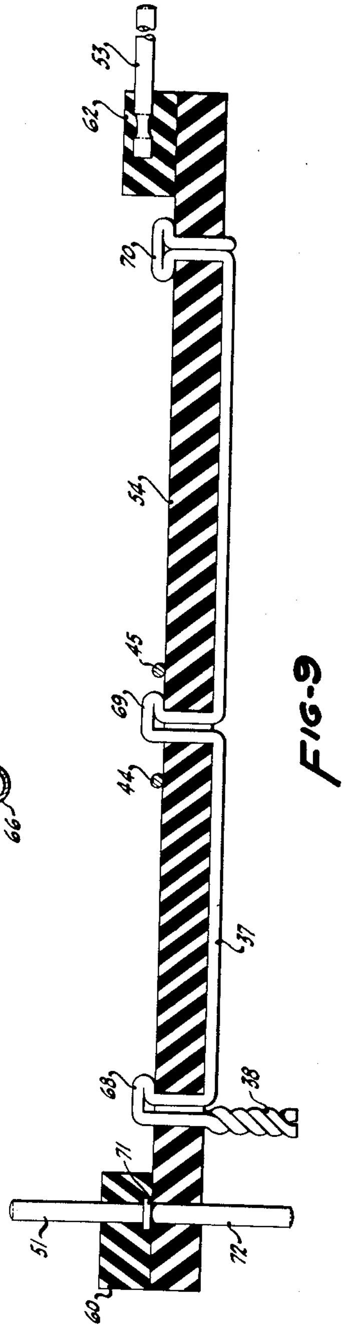
Fig. 9 is a section taken along the line 9—9 of Fig. 6.
Figure 12:
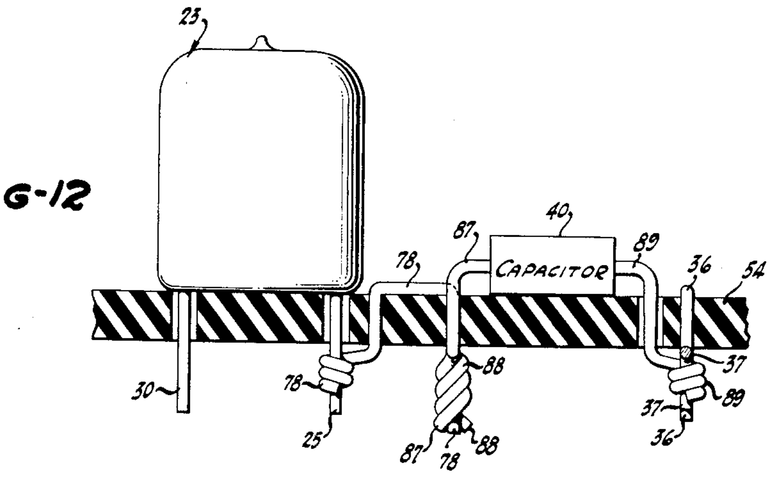
Fig. 12 is a fragmentary section taken along the line 12—12 of Fig. 6.

Another way of preventing electrical contact between crossing conductors is to run one of the conductors along the bottom side of the insulating board. This has been done with wire 37, as is best shown in Fig. 9. Wire 37 is fixed on the board 54 by folded portions 68, 69 and 70 that pierce the board and are flattened or crimped against its upper side. The left end of wire 37 extends downward from folded portion 68 to form a terminal post that is attached to a downwardly extending end of wire 38 by twisting the two together and then soldering the joint. Instead of twisting the two wire ends together, either could have been wrapped around the other. Beyond folded portion 70 wire 37 extends perpendicular to the plane of Fig. 9 and consequently the right end of wire 37 is not shown in this figure. It is shown in Fig. 12.

Fig. 9 also shows ways in which the locator pins of the male connectors may be attached. For example, pin 51 extends through a hole in strip 60, and is held in place by a collar or head 71. An extension 72 of pin 51 extends downward to form a locator pin for the connector comprising the left ends of wires 42 and 43. Pin 53 is molded into insulating strip 62.

Figure 10:
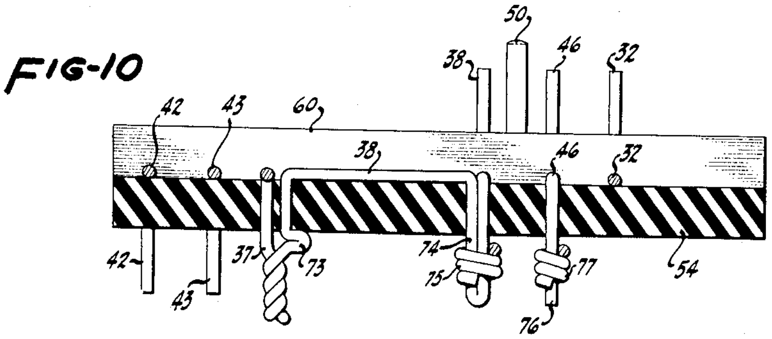
Fig. 10 is a section taken along the line 10—10 of Fig. 6.

Referring to Fig. 10 the left end of wire 38 pierces insulating board 54 and is crimped as shown at 73 to lock the end of the wire securely in place. The end of wire 38 then continues downward and is twisted together with the end of wire 37 for connecting the two wires in series. A folded portion 74 of wire 38 pierces board 54 and forms a terminal post for the attachment of one lead 75 of grid-leak resistor 41. Beyond folded portion 74, wire 38 continues perpendicular to the plane of Fig. 10 as is best shown in Fig. 6. One end of wire 46 pierces board 54 and forms a terminal post 76 to which is attached one lead 77 of capacitor 47.

Figure 11:
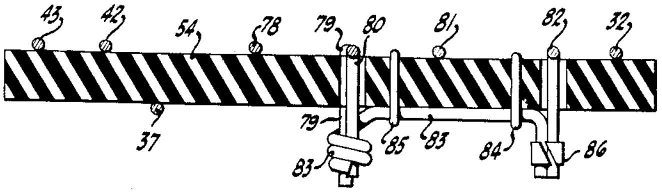
Fig. 11 is a section taken along the line 11—11 of Fig. 6.

With reference to Fig. 11, wire 78 connects vacuum tube pin 25 to resistor 39 and capacitor 40. Wire 79 is a U-shaped staple having two ends that pierce board 54, of which one end is connected to vacuum tube pin 26 while the other end is partly shown in Fig. 11. Wire 80 is one lead of capacitor 35. Wire 81 connects vacuum tube pin 27 to resistor 33 and capacitor 49. Wire 82 is one lead of resistor 34.

Wire 83 extends underneath insulating board 54 and is fastened thereto by staples 84 and 85, which may be applied by an ordinary stapling machine or the like. The left end of wire 83 is wrapped around the downwardly extending ends of wire 79 and lead 80, thus forming a strong mechanical joint between wires 79, 80 and 83. The right end of wire 83 is bent downward alongside the downward extending end of lead 82 and is fastened thereto by means of a mechanical pressure connector such as the metal band 86 wrapped around the two wires. Both of these joints, as well as the other joints herein described, would of course be soldered during the dip-soldering operation hereinbefore described. In the case of a short wire such as wire 83, the wire could be supported entirely by the connections at its two ends. However, staples such as are shown at 84 and 85 are useful for supporting longer lengths of wire, and in the case of either long or short wires the staples are useful during fabrication of the network since the wire is held in place by the staples even before its ends are connected into the circuit. This can greatly simplify manufacturing techniques.

Referring to Fig. 12, vacuum tube 23 has a plurality of pins that extend through punched holes in insulating board 54. Two of these pins, 25 and 30, are shown in Fig. 12. The vacuum tube is held in place and electrical connections are made by means of the wires fastened to portions of the vacuum tube pins that extend below the bottom side of the insulating board. For example, wire 78 is wrapped around pin 25, as shown in Fig. 12, to make a firm mechanical joint which may afterwards be soldered. Other wires are fastened to other pins as indicated in Fig. 6. Alternatively, instead of making connections directly to the vacuum tube pins, a tube socket may be attached to insulating board 54, and connections made to pins or terminals of the tube socket. The other end of wire 78 is twisted together with a lead 87 of capacitor 40 and a lead 88 of resistor 39. The other lead 89 of capacitor 40 is wrapped around the downwardly extending ends of wires 36 and 37.

It should be understood that this invention in its broader aspects is not limited to specific embodiments and examples herein illustrated and described, and that the following claim is intended to cover all changes and modifications that do not depart from the true spirit and scope of the invention.

What is claimed is:

The method for manufacturing an electrical network assembly comprising paying out an electrically conductive wire from a feed device, moving said feed device in a selected path across one side of a sheet of insulating material as the wire is being payed out, pushing said wire through said sheet at selected points along the path to fix said wire to said one side of the sheet to form a folded portion projecting outwardly from the other side of the sheet to form a terminal post, punching holes through said sheet at the same time said wires are being pushed through the sheet with one of said holes adjacent to each folded portion of the wire, cutting said wire at a point beyond the end of said selected path to have the cut end project beyond the perimeter of said sheet, similarly laying out and fixing other electrically conductive wires on said one side of the sheet in other respective selected paths and cutting the other wires beyond the ends of their respective selective paths beyond the perimeter of said sheet, and grouping selected cut ends of said wires together in closely spaced relation to form male conductors, placing a plurality of electrical components having leads extending therefrom on said one side of the sheet, threading said leads through respective ones of said holes to extend through said sheet, attaching said leads to respective ones of said terminals for electrically connecting said components to said wires.

References Cited in the file of this patent

UNITED STATES PATENTS

| | | |
|---|---|---|
| 2,039,957 | Hall | May 5, 1936 |
| 2,066,876 | Carpenter | Jan. 5, 1937 |
| 2,581,967 | Mitchell | Jan. 8, 1952 |
| 2,631,184 | Sampson | Mar. 10, 1953 |
| 2,694,249 | Kapp | Nov. 16, 1954 |
| 2,755,453 | Cloutier | July 17, 1956 |

FOREIGN PATENTS

| | | |
|---|---|---|
| 1,079,051 | France | May 19, 1954 |
| 207,281 | Australia | Nov. 17, 1955 |